United States Patent
Maeda

(10) Patent No.: US 10,516,247 B2
(45) Date of Patent: Dec. 24, 2019

(54) LASER OSCILLATOR

(71) Applicant: FANUC CORPORATION, Yamanashi (JP)

(72) Inventor: Michinori Maeda, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 16/132,572

(22) Filed: Sep. 17, 2018

(65) Prior Publication Data

US 2019/0109429 A1    Apr. 11, 2019

(30) Foreign Application Priority Data

Oct. 10, 2017   (JP) .................................. 2017-197156

(51) Int. Cl.
*H01S 5/024*      (2006.01)
*H01S 3/042*      (2006.01)
*H01S 3/04*       (2006.01)
*H01S 5/00*       (2006.01)
(Continued)

(52) U.S. Cl.
CPC ............ *H01S 3/042* (2013.01); *H01S 3/0407* (2013.01); *H01S 5/0014* (2013.01); *H01S 5/02423* (2013.01); *H01S 5/02453* (2013.01); *H01S 3/0014* (2013.01); *H01S 3/025* (2013.01)

(58) Field of Classification Search
CPC ..... H01S 3/042; H01S 3/0407; H01S 5/02423
See application file for complete search history.

(56) References Cited

U.S. PATENT DOCUMENTS

2017/0163005 A1*   6/2017   Takigawa .............. H01S 5/0014

FOREIGN PATENT DOCUMENTS

| JP | H08-266649 A | 10/1996 |
| JP | 2009-122385 A | 6/2009 |
| JP | 2015-123348 A | 7/2015 |

(Continued)

OTHER PUBLICATIONS

An Office Action mailed by the Japanese Patent Office dated Aug. 6, 2019, which corresponds to Japanese Patent Application No. 2017-197156 and is related to U.S. Appl. No. 16/132,572.

*Primary Examiner* — Michael Carter
(74) *Attorney, Agent, or Firm* — Studebaker & Brackett PC

(57) ABSTRACT

A laser oscillator having a condensation prevention mechanism capable of extending the life span of a light emitting device while maintaining cost effectiveness as compared to the conventional technique is provided. The laser oscillator includes: a laser beam generating unit; a heat exchanger; a coolant bypass circuit; a coolant circuit connecting these components; a housing storing these components; a coolant circulating unit that circulates a coolant to the laser beam generating unit, the heat exchanger, and the coolant bypass circuit with the aid of the coolant circuit; a first valve that adjusts a flow rate of the coolant supplied to the laser beam generating unit; a second valve that adjusts a flow rate of the coolant supplied to the heat exchanger; a third valve that adjusts the flow rate of the coolant supplied to the coolant bypass circuit; a dew point measuring unit that measures a dew point inside the housing; a temperature measuring unit that measures a coolant temperature; and a control unit that controls the first, second, and third valves on the basis of the dew point and the coolant temperature.

12 Claims, 11 Drawing Sheets

(51) Int. Cl.
*H01S 3/00* (2006.01)
*H01S 3/02* (2006.01)

(56) References Cited

FOREIGN PATENT DOCUMENTS

| | | |
|---|---|---|
| JP | 2017-005141 A | 1/2017 |
| JP | 2017-103414 A | 6/2017 |

\* cited by examiner

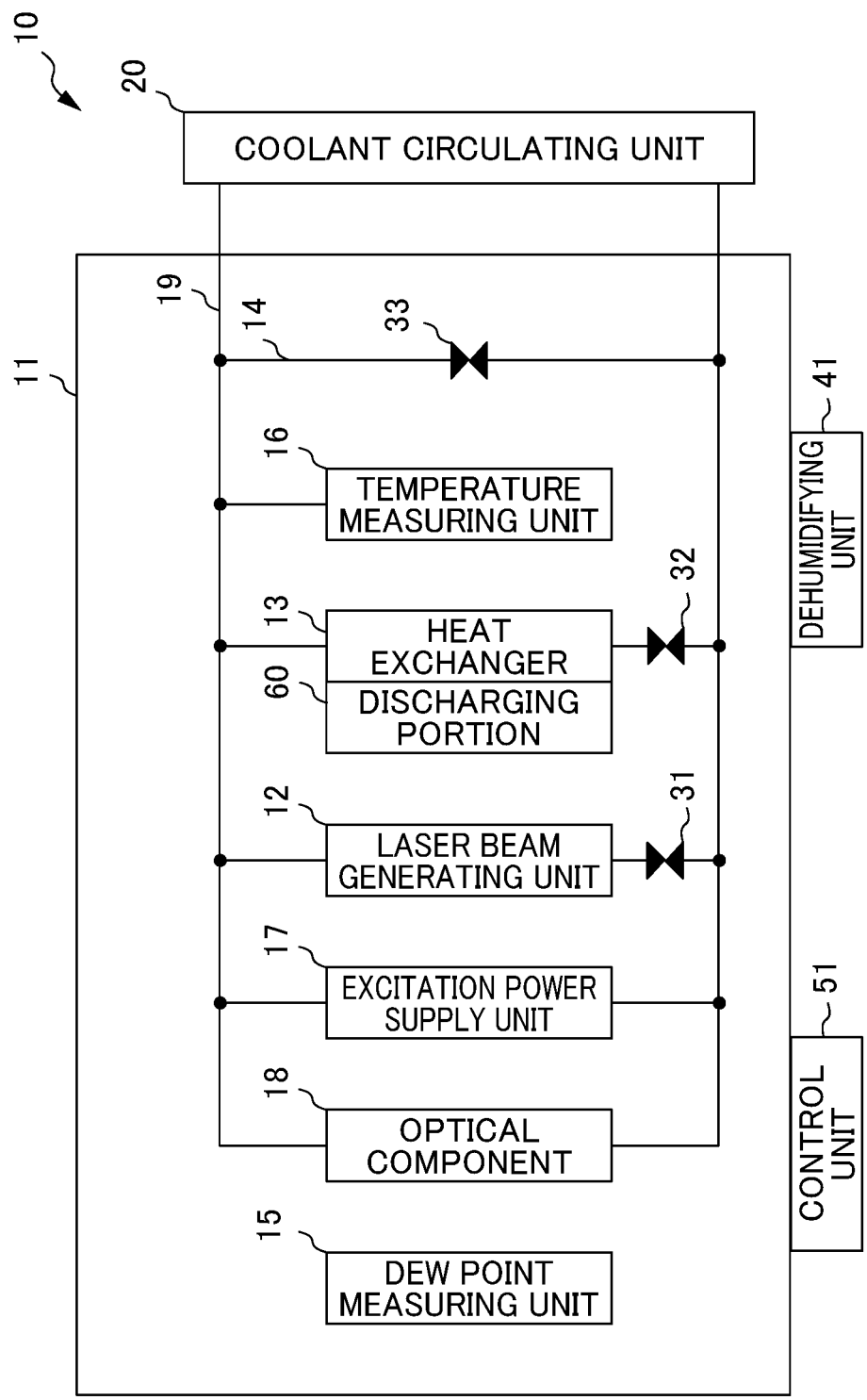

LASER OSCILLATOR

This application is based on and claims the benefit of priority from Japanese Patent Application No. 2017-197156, filed on 10 Oct. 2017, the content of which is incorporated herein by reference.

BACKGROUND OF THE INVENTION

Field of the Invention

The present invention relates to a laser oscillator.

Related Art

In recent years, in a solid-state laser oscillator having an output power of several hundreds of watt used for industrial use, the size of an apparatus has decreased with an improvement in oscillation efficiency associated with an improvement in light emitting devices and optical parts. Moreover, due to an extended life span and a decreased cost of light emitting devices, particularly, application of solid-state laser oscillators in a laser machining field instead of conventional carbon-dioxide laser oscillators has progressed rapidly. Although solid-state laser oscillators have satisfactory efficiency, at least half of input power is discharged as heat. In the case of high-power lasers having an output power exceeding 1 kW, it is necessary to cool a light emitting device using a coolant in order to maintain the light emitting device at a temperature as low as possible. Therefore, for example, as illustrated in FIG. 9, a laser oscillator 80 includes a coolant circulating unit 85 and a laser beam generating unit 82, an excitation power supply unit 83, an optical part 84, and the like stored in a housing 81 are cooled by a coolant through a coolant circuit 86. In this way, the coolant is controlled to maintain a temperature of approximately 20° C. to 30° C. to maintain the light emitting device at a temperature as low as possible so that the temperature does not increase too high. In this way, the life span and the reliability of the light emitting device is secured.

However, solid-state laser oscillators are more vulnerable to condensation than carbon-dioxide laser oscillators, and a little condensation can cause failures in light emitting devices and decrease the operating life span. Particularly, an installation environment of industrial laser oscillators is not always a cool and dry environment but is a high-temperature and high-humidity environment, which is generally a severe use environment for light emitting devices which are semiconductors. Due to this, a method of managing humidity of a storage portion of a light emitting device and the surrounding thereof using dehumidifying means such as an air conditioner or a moisture absorbent so that condensation does not occur in the light emitting device may be used. In such a high-temperature and high-humidity use environment, the internal temperature and humidity of the laser oscillator 80 may increase in a non-operating period in the nighttime, for example, the dew point inside the laser oscillator 80 (particularly the dew point around the laser beam generating unit 82 including a semiconductor such as a light emitting device) may increase during operation of the laser oscillator 80. In this case, when a coolant is supplied to start laser oscillation simultaneously with activation of the laser oscillator 80, condensation may occur in the laser beam generating unit 82 if the dew point inside the housing 81 is higher than the temperature of the coolant. When condensation occurs, the possibility of an electrical short and contamination or corrosion of components may increase, which may cause failures in light emitting devices and shorten the life span, as described above.

In this regard, for example, Patent Document 1 or the like discloses a technique in which the dew point inside the housing of a solid-state laser oscillator and a coolant temperature are measured, and since the danger of condensation increases, circulation or a coolant is stopped to inhibit laser oscillation when the dew point inside the housing is higher than the coolant temperature at the time of activation of the laser oscillator For example, as illustrated in FIG. 10, a laser oscillator 80A includes a dew point measuring unit 87, a temperature measuring unit 88, and a dehumidifying unit 89, which are well known to those skilled in the art. By doing so, when the dew point inside a housing 81 is higher than the coolant temperature at the time of activation of the laser oscillator 80A, since the danger of condensation increases, circulation of a coolant is stopped and a process of inhibiting laser oscillation is performed and the dehumidifying unit 89 is operated to decrease the dew point inside the housing 81 of the laser oscillator 80A. After that, at a time point when the dew point inside the housing 81 is lower than the coolant temperature, a control unit 91 issues an activation command to the coolant circulating unit 85 to start passing the coolant to the laser beam generating unit 82 to allow laser oscillation to thereby prevent condensation.

FIG. 11 illustrates an example of a relation between a dew point inside the housing 81, a change over time in a coolant temperature and a coolant setting temperature, and a control content of the control unit 91. Here, FIG. 11 will be described. At a control start point $T_{00}$, the coolant setting temperature is lower than the dew point inside the housing 81. Furthermore, the coolant temperature is higher than the coolant setting temperature. This is because the coolant circulating unit 86 is not operating yet. That is, the coolant is not passed to the laser beam generating unit 82. At time point $T_{01}$, the control unit 91 activates the laser oscillator 80A and operates the dehumidifying unit 89. In this way, the dew point inside the housing 81 decreases. At time point $T_{02}$, the dew point inside the housing 81 is lower than the coolant temperature. In response to this, the control unit 91 issues an activation command to the coolant circulating unit 85 to pass the coolant from the coolant circulating unit 85 to the laser beam generating unit 82 and to allow laser oscillation. After time point $T_{02}$, the coolant temperature decreases continuously to approach the coolant setting temperature.

As described above, when the dew point is decreased by dehumidifying the storage portion of the light emitting device and the surrounding thereof using dehumidifying means such as a moisture absorbent so that condensation does not occur in the light emitting device at the time of activating the laser oscillator 80A, a certain standby time is necessary. Therefore, laser oscillation is not performed in that period and the operation rate of the entire laser machining device decreases. As a solving method, a method of operating the dehumidifying unit and the coolant circulation device all over the night and a method of installing a laser oscillator in a special area where air-conditioning works. However, these methods may increase the running cost.

In this respect, for example, Patent Document 2 discloses a technique in which a coolant heating means 27 is provided to shorten the standby time until laser oscillation starts, and a coolant is heated by the coolant heating means 27 according to a command from a control unit 12 so that ((dew point)+α (first predetermined temperature difference))≤ (coolant temperature) to thereby shorten the standby time. After that, during laser oscillation of a laser oscillator, the temperature of a coolant supplied to respective components stored in the housing of the laser oscillator is controlled to be within a predetermined range, and a dehumidifying unit continuously performs a dehumidifying operation so that a relation of ((dew point inside housing of laser oscillator)+ (first predetermined temperature difference)≤(coolant temperature)) is maintained.

Patent Document 1: Japanese Unexamined Patent Application, Publication No. H08-266649

Patent Document 2: Japanese Unexamined Patent Application, Publication No. 2017-103414

SUMMARY OF THE INVENTION

The above-described technique is effective as means for shortening the standby time until laser oscillation starts. In addition to this, a laser oscillator having a condensation prevention mechanism capable of shortening the standby time until laser oscillation starts after the laser oscillator is activated, and extending the life span of a light emitting device while maintaining cost effectiveness is required.

An object or the present invention is to provide a laser oscillator having a condensation prevention mechanism capable of shortening the standby time until laser oscillation starts after the laser oscillator is activated, and extending the life span of a light emitting device while maintaining cost effectiveness as compared to the conventional technique.

(1) A first laser oscillator (for example, a laser oscillator 10 to be described later) according to the present invention includes: a laser beam generating unit (for example, a laser beam generating unit 12 to be described later); a heat exchanger (for example, a heat exchanger 13 to be described later) that cools a surrounding with a coolant; a coolant bypass circuit (for example, a coolant bypass circuit 14 to be described later); a coolant circuit (for example, a coolant circuit 19 to be described later) connected to the laser beam generating unit, the heat exchanger, and the coolant bypass circuit; a housing (for example, a housing 11 to be described later) that stores the laser beam generating unit, the heat exchanger, the coolant bypass circuit, and the coolant circuit; a coolant circulating unit (for example, a coolant circulating unit 20 to be described later) that circulates the coolant to the laser beam generating unit, the heat exchanger, and the coolant bypass circuit with the aid of the coolant circuit; a first valve (for example, a first valve 31 to be described later) that adjusts a flow rate of the coolant supplied to the laser beam generating unit; a second valve (for example, a second valve 32 to be described later) that adjusts a flow rate of the coolant supplied to the heat exchanger; a third valve (for example, a third valve 33 to be described later) that adjusts a flow rate of the coolant supplied to the coolant bypass circuit; a dew point measuring unit (for example, a dew point measuring unit 15 to be described later) that measures a dew point inside the housing; a temperature measuring unit (for example, a temperature measuring unit 16 to be described later) that measures a temperature of the coolant; and a control unit (for example, a control unit 51 to be described later) that controls the first, second, and third valves on the basis of the dew point and the coolant temperature.

(2) In the laser oscillator (for example, a laser oscillator 10 to be described later) according to (1), the coolant circulating unit (for example, a coolant circulating unit 20 to be described later) may be provided outside the housing (for example, a housing 11 to be described later).

(3) in the laser oscillator (for example, a laser oscillator 10A to be described later) according to (1), the coolant circulating unit (for example, a coolant circulating unit 20 to be described later) may be provided inside the housing (for example, a housing 11 to be described later).

(4) A second user oscillator (for example, a laser oscillator 10B to be described later) according to the present invention includes: a laser beam generating unit (for example, a laser beam generating unit 12 to be described later); a heat exchanger (for example, a heat exchanger 13 to be described later) that cools a surrounding with a refrigerant; a coolant bypass circuit (for example, a coolant bypass circuit 14 to be described later); a coolant circuit (for example, a coolant circuit 19 to be described later) connected to the laser beam generating unit and the coolant bypass circuit; a refrigerant circuit (for example, a refrigerant circuit 25A to be described later) connected to the heat exchanger; a coolant circulating unit (for example, a coolant circulating unit 20 to be described later) that circulates a coolant to the laser beam generating unit and the coolant bypass circuit with the aid of the coolant circuit and circulates the refrigerant to the heat exchanger with the aid of the refrigerant circuit; a housing (for example, a housing 11 to be described later) that stores the laser beam generating unit, the heat exchanger, the coolant bypass circuit, the coolant circuit, and the coolant circulating unit; a first valve (for example, a first valve 31 to be described later) that adjusts a flow rate of the coolant supplied to the laser beam generating unit; a second valve (for example, a second valve 32 to be described later) that adjusts a flow rate of the refrigerant supplied to the heat exchanger; a third valve (for example, a third valve 33 to be described later) that adjusts a flow rate of the coolant supplied to the coolant bypass circuit; a dew point measuring unit (for example, a dew point measuring unit 15 to be described later) that measures a dew point inside the housing; a temperature measuring unit (for example, a temperature measuring unit 16 to be described later) that measures a temperature of the coolant; and a control unit (for example, a control unit 51 to be described later) that controls the first, second, and third valves on the basis of the dew point and the coolant temperature.

(5) The laser oscillator (for example, a laser oscillator 10, 10A, 10B to be described later) according to any one of (1) to (4) may further include: a discharging portion (for example, a discharging portion 60 to be described later) that discharges moisture condensed to the heat exchanger (for example, a heat exchanger 13 to be described later) and the coolant circuit (for example, a coolant circuit 19 to be described later) to the outside of the housing.

(6) The laser oscillator (for example, a laser oscillator 10, 10A, 10B to be described later) according to any one of (1) and (3) to (5) may further include a collecting unit (for example, a collecting unit 70 to be described later) that collects moisture condensed to the heat exchanger (for example, a heat exchanger 13 to be described later) and the coolant circuit (for example, a coolant circuit 19 to be described later) to the coolant circulating unit (for example, a coolant circulating unit 20 to be described later).

(7) The laser oscillator (for example, a laser oscillator 10, 10A, 10B to be described later) according to any one of (1) and (3) to (6) may further include a dehumidifying unit (for example, a dehumidifying unit 41 to be described later) provided inside the housing (for example, a housing 11 to be described later); and a collecting unit (for example, a collecting unit 70 to be described later) that collects moisture generated from the dehumidifying unit to the coolant circulating unit.

(8) In the laser oscillator (for example, a laser oscillator 10, 10A, 10B to be described later) according to any one of (1) to (7), when the dew point measured by the dew point measuring unit (for example, a dew point measuring unit 15 to be described later) is higher than the coolant temperature measured by the temperature measuring unit (for example, a temperature measuring unit 16 to be described later), the control unit (for example, a control unit 51 to be described later) may close the first valve (for example, a first valve 31 to be described later) and open the second and third valves (for example, second and third valves 32 and 33 to be described later) to inhibit laser oscillation.

(9) In the laser oscillator (for example, a laser oscillator 10, 10A, 10B) according to any one of (1) to (8), when the dew point measured by the dew point measuring unit (for example, a dew point measuring unit 15 to be described later) is lower than the coolant temperature measured by the temperature measuring unit (for example, a temperature measuring unit 16 to be described later), the control unit (for example, a control unit 51 to be described later) may open the first valve (for example, a first valve 31 to be described later) and close the third valve (for example, a third valve 33 to be described later) to allow laser oscillation.

(10) In the laser oscillator (for example, a laser oscillator 10, 10A, 10B to be described later) according to any one of (1) to (9), the control unit (for example, a control unit 51 to be described later) may calculate a first temperature obtained by adding a predetermined temperature to the dew point measured by the dew point measuring unit (for example, a dew point measuring unit 15 to be described later) and send the first temperature to the coolant circulating unit (for example, a coolant circulating unit 20 to be described later) as a setting temperature.

(11) In the laser oscillator (for example, a laser oscillator 10, 10A, 10B to be described later) according to any one of (1) to (10), the control unit (for example, a control unit 51 to be described later) may send a flow rate of the coolant to at least one of the first, second, and third valves (for example, first, second, and third valves 31, 32, and 33 to be described later) on the basis of the dew point measured by the dew point measuring unit (for example, a dew point measuring unit 15 to be described later) and the coolant temperature measured by the temperature measuring unit (for example, a temperature measuring unit 16 to be described later).

(12) In the laser oscillator (for example, a laser oscillator 10, 10A, 10B to be described later) according to (10), the control unit (for example, a control unit 51 to be described iater) may inhibit laser oscillation when the first temperature is higher than a second predetermined temperature or lower than a third predetermined temperature.

According to the present invention, it is possible to provide a condensation prevention mechanism capable of extending the life span of a light emitting device while maintaining cost effectiveness as compared to the conventional technique.

BRIEF DESCRIPTION OF THE DRAWINGS

FIG. 1 is a diagram illustrating an overall configuration of a laser oscillator according to a first embodiment of the present invention.

DETAILED DESCRIPTION OF THE INVENTION

1. First Embodiment

Figure 2A:
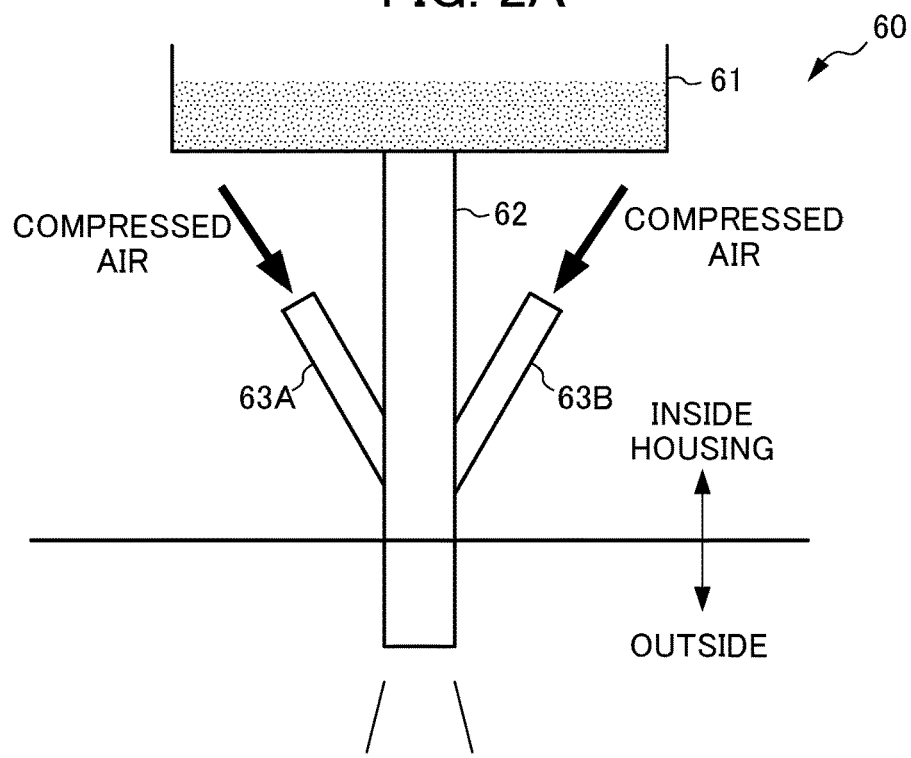
FIG. 2A is a diagram illustrating a configuration of a discharging portion according to a first embodiment of the present invention.

Hereinafter, a first embodiment of the present invention will be described with reference to FIGS. 1 to 5.

1.1 Configuration of Invention

A configuration of a laser oscillator 10 according to a first embodiment of the present invention will be described. FIG. 1 is a functional block diagram of the laser oscillator 10. As illustrated in FIG. 1, the laser oscillator 10 includes a housing 11, a coolant circulating unit 20 provided outside the housing 11, and a control unit 51. Furthermore, inside the housing 11, a laser beam generating unit 12, a heat exchanger 13, a coolant bypass circuit 14, a dew point measuring unit 15, a temperature measuring unit 16, an excitation power supply unit 17, an optical part 18, a coolant circuit 19, a first valve 31, a second valve 32, a third valve 33, a dehumidifying unit 41, and a discharging portion 60 are stored.

Housing 11

The housing 11 has a degree of air-tightness necessary for suppressing the flow rate of air entering into the laser oscillator 10 from the outside of the laser oscillator 10 to a predetermined value or smaller.

Laser Beam Generating Unit 12

The laser beam generating unit 12 has an arbitrary well-known configuration and generates a laser beam. Particularly, the laser beam generating unit 12 generates a laser beam through the optical part 18 to be described later. A coolant circulating from the coolant circulating unit 20 is supplied to the laser beam generating unit 12 through the first valve 31 formed as an electromagnetic valve, for example. The first valve 31 is a valve that can be open and closed to adjust the amount of a coolant circulating in the laser beam generating unit 12 in response to a command from the control unit 51. When the first valve 31 is controlled to be in an open state, a coolant can be circulated between the coolant circulating unit 20 and the laser beam generating unit 12. When the first valve 31 is controlled to be in a closed state, a coolant can be prevented from circulating through the laser beam generating unit 12. The details of the control related to the first valve 31 will be described later.

Heat Exchanger 13

The heat exchanger 13 causes the moisture in the laser oscillator to be condensed to the heat exchanger 13 by supplying a coolant to decrease the dew point inside the laser oscillator. The moisture condensed to the heat exchanger is discharged to the outside by the discharging porton 60. More specifically, the heat exchanger 13 causes the moisture in the laser oscillator to be condensed to the heat exchanger 13 by supplying a coolant during activation of the laser oscillator 10, for example, in order to decrease the dew point inside the laser oscillator. The discharging portion 60 which is a means for discharging the moisture to the outside of the laser oscillator 10 so that the moisture condensed and adhering to the heat exchanger 13 does not evaporate again. A saucer and an external drain tube may be provided as the discharging portion 60, and the condensed and adhering moisture may be forcibly discharged using vacuum force or compressed air.

Figure 2B:
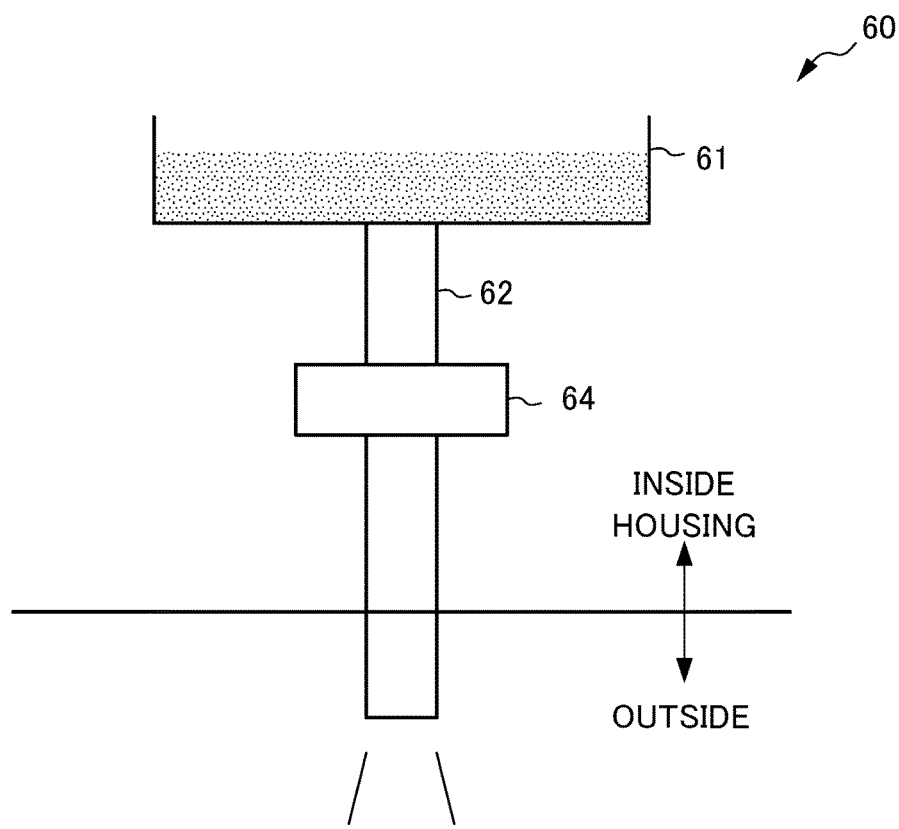
FIG. 2B is a diagram illustrating a configuration of a discharging portion according to the first embodiment of the present invention.

FIG. 2A illustrates an example of the discharging portion 60. The discharging portion 60 includes a saucer 61 that receives condensed water and a pipe 62 for discharging the water collected in the saucer to the outside of the housing 11. Furthermore, air pipes 63A and 63B for sending compressed air into the pipe 62 are provided in the pipe 62. By doing so, the water collected in the saucer 61 is discharged to the outside of the housing 11 by a negative pressure generated by the compressed air sent to the air pipes 63A and 63B. FIG. 2B illustrates another example of the discharging portion 60. A discharging portion 60A includes a saucer 61 that receives the condensed water and a vacuum pump 64 for discharging the water collected in the saucer to the outside of the housing 11 similarly to the discharging portion 60. By doing so, the water collected in the saucer 61 is discharged to the outside of the housing 11 by the negative pressure generated by the vacuum pump 64. In the coolant circulating unit 20, when moisture in the housing 11 is condensed to a component (for example, the coolant bypass circuit 14, the coolant circuit 19, and the like) other than the heat exchanger 13 and water adheres thereto when a coolant having a temperature lower than the dew point is supplied, the water may be discharged to the outside of the housing 11 by the discharging portion 60 similarly to the heat exchanger 13 so that the water does not evaporate again.

By decreasing the dew point inside the laser oscillator during activation of the laser oscillator 10, for example, using the heat exchanger 13, it is possible to shorten the standby time until laser oscillation starts after the laser oscillator 10 is activated. The heat exchanger 13 may have a function of collecting heat generated in a warehouse and dehumidifying during a normal operation of the laser oscillator 10 as well as dehumidifying during activation of the laser oscillator 10.

The coolant circulating from the coolant circulating unit 20 is supplied to the heat exchanger 13 through the second valve 32 formed as an electromagnetic valve, for example. The second valve 32 is a valve that can be open and closed to adjust the amount of a coolant circulating in the heat exchanger 13 in response to a command from the control unit 51. When the second valve 32 is controlled to be in an open state, a coolant can be circulated between the coolant circulating unit 20 and the heat exchanger 13. When the second valve 32 is controlled to be in a closed state, a coolant can be prevented from circulating through the heat exchanger 13. The details of the control related to the heat exchanger 13 and the second valve 32 will be described later.

Coolant Bypass Circuit 14

The coolant bypass circuit 14 is a passage for bypassing the coolant from the coolant circulating unit 20 and includes a third valve 33 formed as an electromagnetic valve, for example. The third valve 33 is a valve that can be open and closed to adjust the amount of a coolant circulating in the coolant bypass circuit 14 in response to a command from the control unit 51. When the third valve 33 is controlled to be in an open state, a coolant can be circulated between the coolant circulating unit 20 and the coolant bypass circuit 14. When the third valve 33 is controlled to be in a closed state, a coolant can be prevented from circulating through the coolant bypass circuit 14. For example, when the flow rate of a coolant circulating in the laser oscillator 10 is controlled to be constant (for example, when the supply of water to the components of the laser oscillator 10 is stopped), by controlling the third valve 33 to be in an open state, it is possible to prevent an increase in the pressure in the other components in which a coolant circulates. In this way, it is possible to prevent leakage of water. The details of the control related to the third valve 33 will be described later.

The dew point measuring unit 15 measures the dew point inside the housing 11. More specifically, the dew point measuring unit 15 measures the dewy point inside the housing 11 on the basis of the temperature of air in the housing 11 and the humidity in the housing 11. The dew point measuring unit 15 may be disposed near a portion such as the laser beam generating unit where failure is likely to occur due to condensation and may be disposed so that a plurality of positions can be measured. The temperature measuring unit 16 measures the temperature of a coolant supplied from the coolant circulating unit 20 into the housing 11 by the coolant circuit 19.

The excitation power supply unit 17 supplies a driving current to the laser beam generating unit 12. The optical part 18 is an optical part such as, for example, a mirror, a lens, an optical fiber, or a quartz block, through which a laser beam generated from the laser beam generating unit 12 passes.

The coolant circuit 19 is a passage for circulating the coolant from the coolant circulating unit 20 to the laser beam generating unit 12, the heat exchanger 13, the coolant bypass circuit 14, the temperature measuring unit 16, the excitation power supply unit 17, and the optical part 18. FIG. 1 illustrates an example in which the coolant bypass circuit 14, the temperature measuring unit 16, the heat exchanger 13, the laser beam generating unit 12, the excitation power supply unit 17, and the optical part 18 are provided in that order from the upstream side of the coolant circulating unit 20, the arrangement, thereof is not limited thereto. These components may be arranged in an arbitrary order from the upstream side of the coolant circulating unit 20 and may be arranged appropriately so that the coolant is circulated in series.

Coolant Circulating Unit 20

The coolant circulating unit 20 is a chiller, for example, and causes a coolant to circulate through the coolant circuit 1 in order to cool heat generating components inside the housing 11 and maintains the coolant at a predetermined temperature according to the control of the control unit 51 to be described later.

Figure 3A:
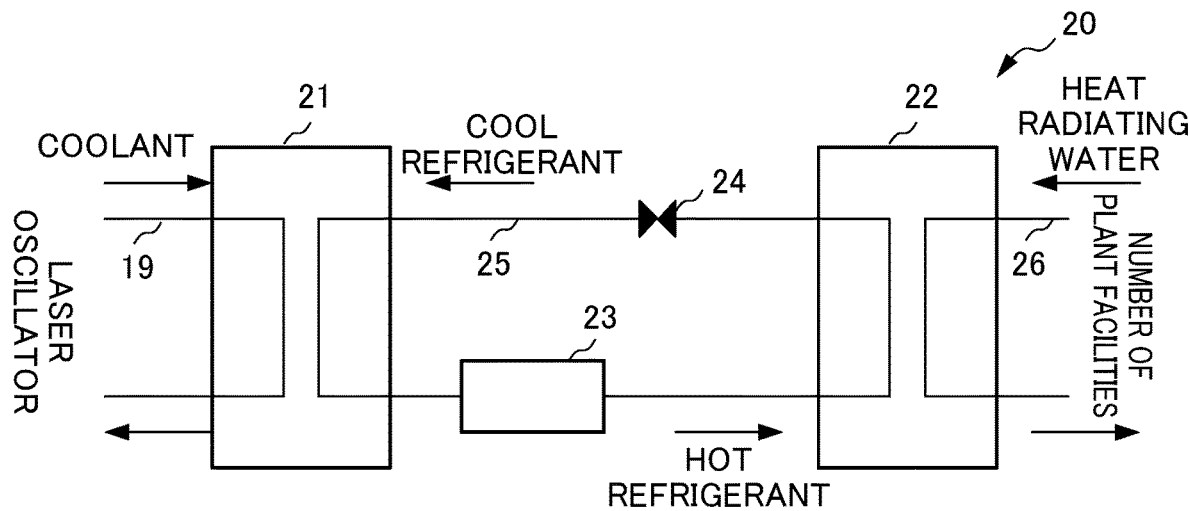
FIG. 3A is a diagram illustrating a configuration of a coolant circulating unit according to the first embodiment of the present invention.
Figure 3B:
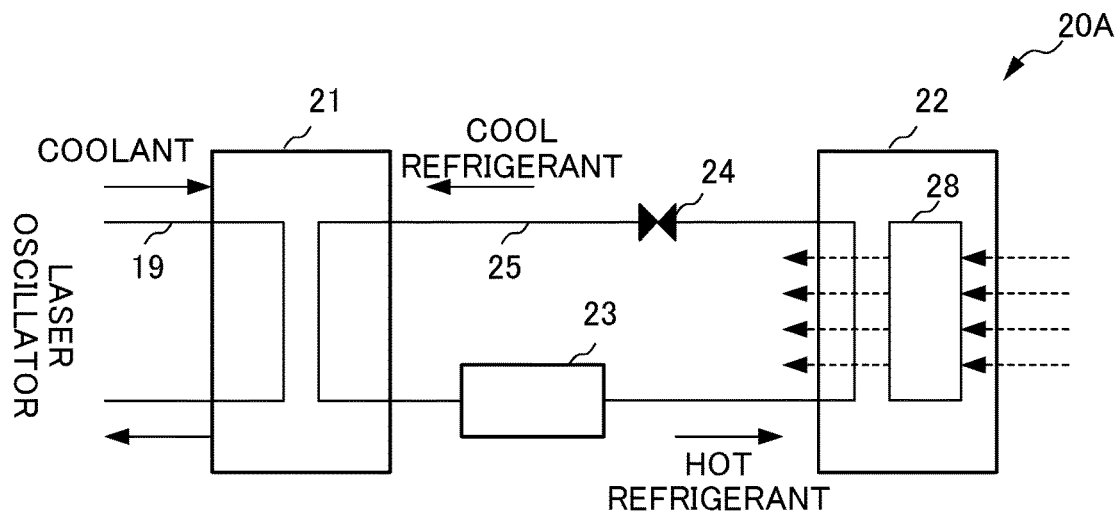
FIG. 3B is a diagram illustrating a configuration of the coolant circulating unit according to the first embodiment of the present invention.

FIG. 3A illustrates an example of the coolant circulating unit 20. The coolant circulating unit 20 mainlyincludes a coolant cooling unit 21, a refrigerant cooling unit 22, and a compressor 23. A refrigerant circulating through a refrigerant circuit 25 is cooled by heat radiating water circulating through a heat radiating water circuit 26 in the refrigerant cooling unit 22 and the temperature of the refrigerant is decreased by adiabatic expansion of the compressor 23 and an expansion valve 24 provided in the refrigerant circuit 25. Furthermore, in the coolant cooling unit 21, a coolant circulating through the coolant circuit 19 is cooled by a refrigerant circulating through the refrigerant circuit 25. FIG. 3B illustrates a coolant circulating unit 20A as another example of the coolant circulating unit 20. A refrigerant circulating through the refrigerant circuit 25 is cooled by a cooling fan 28 in the refrigerant cooling unit 22 and the temperature thereof is decreased by adiabatic expansion of the compressor 23 and the expansion valve 24 provided in the refrigerant circuit 25. Furthermore, in the coolant cooling unit 21, a coolant circulating through the coolant circuit 19 is cooled by a refrigerant circulating through the refrigerant circuit 25.

Dehumidifying Unit 41

The dehumidifying unit 41 dehumidifies the air inside the housing 11. The dehumidifying unit 41 includes any device having a dehumidifying function, including those such as a cooler, commonly called by names other than the "dehumidifying unit". The dehumidifying unit 41 may be a thermoelectric cooling dehumidifier which uses a Peltier-effect device, for example. For example, when the dehumidifying unit 41 operates continuously or nearly continuously, the probability of failures in the dehumidifying unit 41 can be decreased by using a thermoelectric cooling dehumidifier which uses a Peltier-effect device that has no movable parts and is less prone to wear as the dehumidifying unit 41.

Control Unit 51

Figure 4:
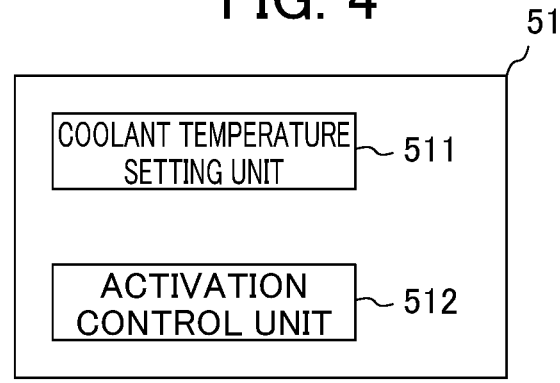
FIG. 4 is a functional block diagram of a control unit included in the laser oscillator according to the first embodiment of the present invention.

The control unit 51 controls the first, second, and third valves 31, 32, and 33 on the basis of the dew point inside the housing 11 measured by the dew point measuring unit 15 and the temperature of the coolant measured by the temperature measuring unit 16 and allows or inhibits laser oscillation. More specifically, an allowable lower limit of the coolant temperature and an allowable upper limit of the coolant temperature during laser oscillation are set in advance to the control unit 51 before activation of the laser oscillator 10. By doing so, the control unit 51 allows laser oscillation when the coolant temperature is within the range of the allowable lower limit and the allowable upper limit until an operation of the laser oscillator stops after the laser oscillator is activated. The control unit 51 stops (inhibits) laser oscillation upon detecting that the coolant temperature is lower than the allowable lower limit or exceeds the allowable upper limit. The control unit 51 includes a coolant temperature setting unit 511 and an activation control unit 512 as illustrated in FIG. 4 in order to shorten the standby time until laser oscillation starts after the laser oscillator 10 is activated in addition to the control related to allowing and inhibiting of the laser oscillation. FIG. 4 illustrates a functional block diagram of the control unit 51.

Coolant Temperature Setting Unit 511

First, the coolant temperature setting unit 511 can set the setting value of the coolant temperature in the coolant circulating unit 20 arbitrarily. More specifically, the control unit 51 can set the initial value of the coolant temperature in the coolant circulating unit 20 in advance before activation of the iaser oscillator 10. Moreover, the control unit 51 can set the setting value of the coolant temperature in the coolant circulating unit 20 dynamically after the laser oscillator 10 is activated.

Activation Control Unit 512

The activation control unit 512 determines that there is a possibility of condensation upon detecting that the dew point inside the housing 11 measured by the dew point measuring unit 15 during activation of the laser oscillator 10 is higher than the coolant temperature measured by the temperature measuring unit 16. The activation control unit 512 causes the coolant circulating unit 20 to start passing a coolant, controls the third valve 33 to be in an open state to pass the coolant to the coolant bypass circuit 14, controls the first valve 31 to be in a closed state so that the coolant does not circulate through the laser beam generating unit 12 and laser oscillation is inhibited. By doing so, condensation in the laser beam generating unit 12 can be prevented. In this case, if there is a device that goes wrong when it is condensed, another valve may be provided so that a coolant is not passed to the device by the activation control unit 512 controlling opening and closing of the valve. The activation control unit 512 operates the dehumidifying unit 41. The activation control unit 512 may operate a coolant feed pump in a state where coolant temperature control is turned off to cause the coolant circulating unit 20 to start passing the coolant. In this way, it is possible to prevent condensation in the laser beam generating unit 12, and the activation control unit 512 can increase the coolant temperature by the heat generated by the coolant feed pump included in the coolant circulating unit 20 by passing the coolant to the coolant bypass circuit 14. Moreover, since passing of a coolant to the laser beam generating unit 12 is stopped, the flow rate of the coolant is decreased as compared to a normal state. Therefore, since the workload of the coolant feed pump included in the coolant circulating unit 20 decreases and the heat generation amount decreases, the activation control unit 512 controls the first valve 31 to be in a closed state and the third valve 33 to be in an open state to pass a coolant to the coolant bypass circuit 14 to thereby increase the heat generation amount of the coolant feed pump and increase the coolant temperature. When the coolant circulating unit 20 includes a heater for preventing freezing in the winter season, the coolant temperature may be increased using the heater.

The activation control unit 512 may control the second valve 32 to be in an open state so that a coolant is supplied to the heat exchanger 13 in order to further improve a dehumidifying effect. By doing so, the coolant has a temperature equal to or lower than the dew point, and the surface of the heat exchanger 13 is condensed, and removal of moisture in the housing 11 is accelerated. In this case, as described above, the activation control unit 512 discharges the moisture condensed and adhering to the heat exchanger 13 forcibly with the aid of the discharging portion 60. In order to improve a heat exchange performance and a dehumidifying efficiency, the opening of the second valve 32 may be adjusted by the control of the control unit 51, the air inside the housing 11 may be circulated and agitated by a blower fan or the like, and the air may be guided to the heat exchanger 13 by a rectifying plate or the like.

The activation control unit 512 may dynamically set the coolant temperature setting value in the coolant circulating unit 20 to a temperature which is an addition of a predetermined temperature (also referred to as "first difference value") and the dew point measured by the dew point measuring unit 15 for example every predetermined control period with the aid of the coolant temperature setting unit 511. In this way, the dew point can be decreased by the dehumidification and the laser oscillator 10 can be activated more quickly.

More specifically, the dew point inside the housing 11 decreases by the above-described control of the activation control unit 512. Due to this, a temperature obtained by adding a predetermined temperature (the first difference value) to the dew point also decreases. On the other hand, the temperature of the coolant increases gradually since the coolant temperature control by the coolant circulating unit 20 is turned off. In this way, the activation control unit 512 can allow the laser oscillation immediately at a time point when the dew point measured by the dew point measuring unit 15 is lower than the coolant temperature. Moreover, the activation control unit 512 can turn on the coolant temperature control by the coolant circulating unit 20 immediately at a time point when the coolant temperature exceeds the temperature obtained by adding the predetermined temperature (the first difference value) to the dew point. After that, at a time point when the temperature obtained by adding the predetermined temperature (the first difference value) to the dew point decreases with the decrease of the dew point to reach a predetermined initial value of the coolant temperature in the coolant circulating unit 20, the coolant setting temperature can be set to the initial value quickly. After that, the control unit 51 controls the coolant circulating unit 20 so that the coolant temperature measured by the temperature measuring unit 16 follows t0.

Hereinabove, the function of the activation control unit 512 when it is detected that during activation of the laser oscillator 10, the dew point inside the housing 11 measured by the dew point measuring unit 15 is higher than the coolant temperature measured by the temperature measuring unit 16 has been described. In contrast, when it is detected that during activation of the laser oscillator 10, the dew point inside the housing 11 measured by the dewy point measuring unit 15 is lower than the coolant temperature measured by the temperature measuring unit 16, the activation control unit 512 can allow laser oscillation and operate the dehumidifying unit 41 and activate the heat exchanger 13 as necessary to thereby decrease the dew point further. Moreover, the activation control unit 512 can control the coolant temperature to reach the predetermined initial value of the coolant temperature in the coolant circulating unit 20.

The heat exchanger 13 may have a function of dehumidifying during activation and a function of collecting heat generated inside the housing 11 during a normal operation. Specifically, during a normal operation, the control unit 51 may adjust the flow rate of a coolant or the rotation speed of a blower fan according to an operation mode such as laser oscillation or standby (during stopping of laser oscillation) to thereby collect heat generated in the housing 11.

Operation of Laser Oscillator 10

Figure 5:
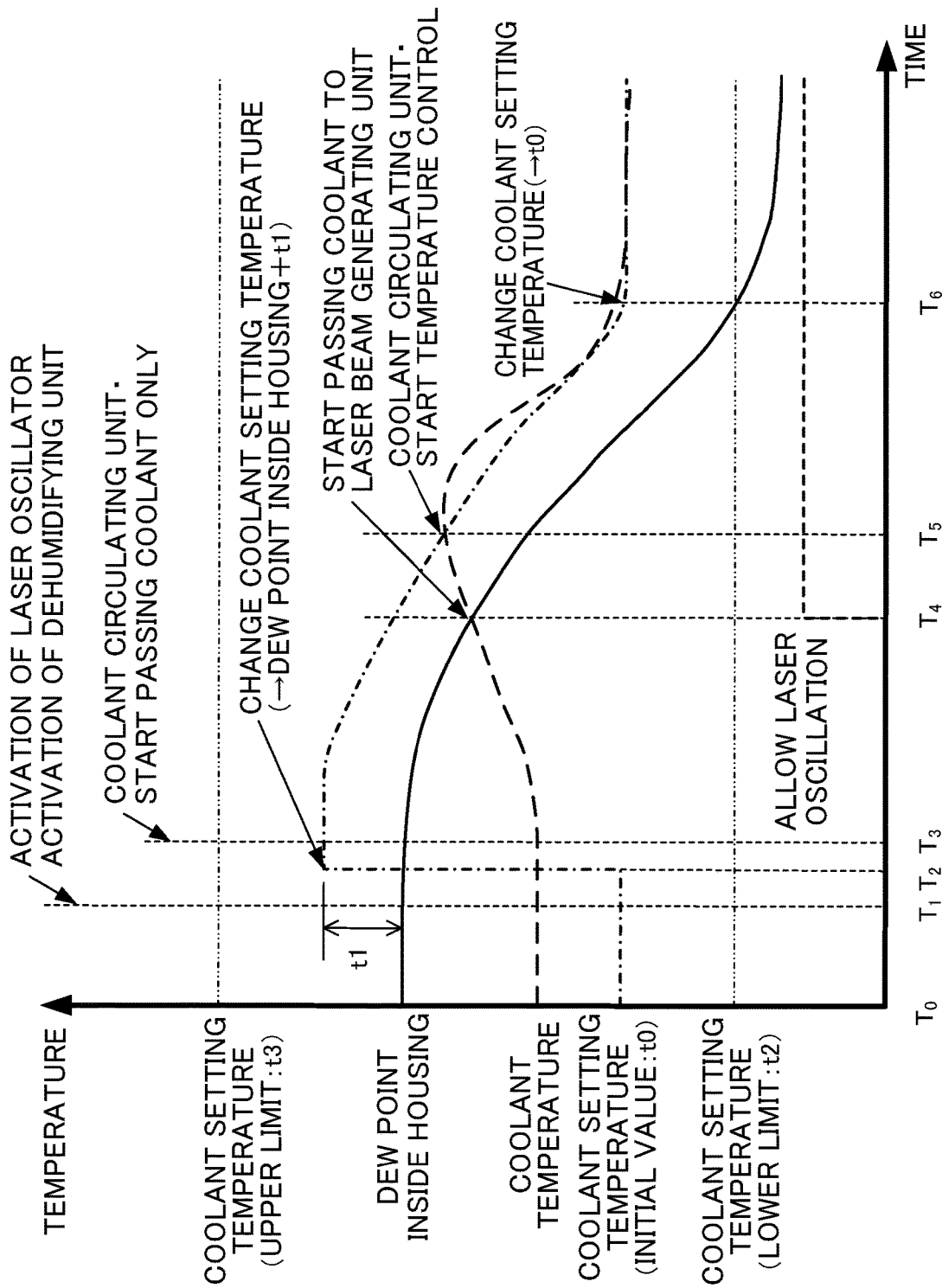
FIG. 5 is a diagram illustrating respective control timings according to the first embodiment of the present invention.

Hereinabove, an embodiment of the laser oscillator 10 according to the present invention has been described on the basis of the components thereof. Next, an operation until laser oscillation starts and a normal operation starts after the laser oscillator 10 is activated will be described. FIG. 5 is a time chart illustrating an operation of the laser oscillator 10.

Referring to FIG. 5, at a control start time point $T_0$, the coolant setting temperature is set to an initial value t0 lower than the dew point inside the housing 11. Since the coolant temperature is an important factor directly related to the life span of a light emitting device, laser oscillation is allowed in a predetermined temperature range (that is, a range between an allowable lower limit temperature t2 of coolant temperature and an allowable upper limit t3 of coolant temperature). That is, when the coolant temperature is outside the range of temperatures t2 and t3, the control unit 51 inhibits laser oscillation.

When the laser oscillator 10 is activated, the dew point measuring unit 15 measures the dew point inside the housing 11. Here, the coolant temperature is lower than the dew point inside the housing 11. At time point $T_1$, the control unit 51 activates the laser oscillator 10 to operate the dehumidifying unit 41 a state in which the first valve 31 is in a closed state and the second and third valves 32 and 33 are in an open state to inhibit the laser oscillation. At time point $T_2$, the control unit 51 controls the coolant circulating unit 20 every predetermined control period, for example, so that the coolant setting temperature is set to a temperature which is an addition of a predetermined temperature t1 and the dew point inside the housing 11 measured by the dew point measuring unit 15. Here, (t0+t1) satisfies a condition of t2<(t0+t1)<t3. At time point $T_3$, the control unit 51 instructs the coolant circulating unit 20 to pass a coolant in a state where the coolant is not cooled and operates the heat exchanger 13. By doing so, the coolant temperature increases and the dew point inside the housing 11 decreases. When the dew point decreases, the coolant setting temperature set to a temperature obtained by adding the predetermined temperature t1 to the dew point also decreases.

At time point $T_4$, when it is detected that the dew point inside the housing 11 measured by the dew point measuring unit 15 is lower than the coolant temperature measured by the temperature measuring unit 16, the control unit 51 opens the first valve 31 to start passing the coolant to the laser beam generating unit 12 and allows laser oscillation. In this case, the control unit 51 closes the third valve 33 in response to the coolant being passed to the laser beam generating unit 12, restores the amount of the coolant supplied to the heat exchanger 13 to an amount during a normal operation so that the flow rate of the coolant in the entire laser oscillator 10 is maintained to be constant.

At time point $T_5$, when it is detected that the coolant temperature measured by the temperature measuring unit 16 exceeds a coolant setting temperature set to be a temperature which is an addition of a predetermined temperature (the first difference value t1) and the dew point inside the housing 11 measured by the dew point measuring unit 15, the control unit 51 instructs the coolant circulating unit 20 to control the coolant temperature.

At time point $T_6$, when it is detected that the coolant temperature measured by the temperature measuring unit 16 reaches the initial value t0, the control unit 51 changes the coolant setting temperature to the initial value t0. In this case, the control unit 51 may terminate the dehumidifying operation during activation of the laser oscillator 10 by the heat exchanger 13 in a state in which the second valve 32 is closed. After that, the control unit 51 controls the coolant circulating unit 20 so that the coolant temperature measured by the temperature measuring unit 16 follows t0. The control unit 51 may control the coolant circulating unit 20 so that (dew point)+α≤t0, for example. Here, α is a predetermined value.

The time chart in FIG. 5 is an example of an operation until laser oscillation starts and a normal operation starts after the laser oscillator 10 is activated, but the present invention is not limited thereto. For example, the operation until laser oscillation starts and a normal operation starts after the laser oscillator 10 is activated illustrated in FIG. 5 illustrates an example in which after the coolant temperature reaches an initial setting temperature t0, the setting temperature returns to the initial setting temperature to from ((dew point))+t1). However, the control unit 51 may determine the possibility of occurrence of inconvenience due to condensation and the influence on the life span of the laser beam generating unit 12, of the coolant temperature from the measurement results of the coolant temperature and the dew point inside the housing 11 and may set the setting temperature to a temperature higher or lower than the initial setting temperature t0 after the coolant temperature reaches the initial setting temperature t0. The control unit 51 may delay the temperature control start time point of the coolant circulating unit 20 by a predetermined time later than time point $T_5$ by taking a delay of a control system and the danger of condensation into consideration. The control unit 51 may set the control start temperature to be slightly higher than the coolant setting temperature t0 (=(dew point inside housing 11)+t1).

1.2 Advantage of First Embodiment

In the embodiment, when the dew point inside the housing 11 is higher than the coolant temperature and the condensation is likely to occur in the laser beam generating unit 12, the control unit 51 stops supplying the coolant to the laser beam generating unit 12 and operates the dehumidifying unit 41 and the heat exchanger 13 to immediately decrease the dew point inside the housing 11. The control unit 51 allows laser oscillation after a stable state in which the dew point is equal to or higher than the coolant temperature and condensation does not occur in the laser beam generating unit 12 is created. In this way, it is possible to provide a laser oscillator having a condensation prevention mechanism capable of preventing destruction of the laser beam generating unit 12 due to condensation, further shortening a standby time until laser oscillation starts after activation of the laser oscillator 10, and extending the life span of the light emitting device while maintaining cost effectiveness.

The coolant circulating unit 30 is provided outside the housing 11. In this way, it is possible to improve maintenance of the coolant circulating unit 30.

The laser oscillator 10 includes the discharging portion 60 that discharges moisture condensed to the heat exchanger 13 and the coolant circuit 19 to the outside of the housing 11. In this way, it is possible to prevent condensed water from evaporating again and increasing the dew point inside the housing 11.

In the laser oscillator 10, when the dew point inside the housing 11 higher than the coolant temperature, the control unit 51 inhibits laser oscillation, closes the first valve and opens the second and third valves to supply a coolant to the heat exchanger 13 having a dehumidifying function. In this way, it is possible to decrease the dew point inside the housing 11 to shorten the standby time until laser oscillation starts after activation of the laser oscillator 10 stably and quickly while protecting the laser beam generating unit 12 from condensation.

In the laser oscillator 10, when the dew point inside the housing 11 is lower than the coolant temperature, the control unit 51 opens the first valve and closes the third valve to allow laser oscillation. In this way, when the dew point inside the housing 11 is lower than the coolant temperature and condensation does not occur during activation of the laser oscillator 10, even if the coolant temperature has not reaches the setting temperature, the control unit 51 allows laser oscillation whereby a laser machining operation can be started quickly.

In the laser oscillator 10, the control unit 51 calculates a first temperature which is an addition of a predetermined temperature and the dew point inside the housing 11 to send the first temperature to the coolant circulating unit 20 as a setting temperature. In this way, the coolant temperature is set to be always higher than the dew point inside the housing 11 whereby condensation inside the housing 11 can be prevented reliably.

In the laser oscillator 10, the control unit 51 sends the flow rate of a coolant to at least one of the first to third valves 31 to 33 on the basis of a relation between the coolant temperature and the dew point inside the housing 11. In this way, it is possible to distribute flow rates optimally to respective portions in order to decrease the dew point inside the housing 11 and to suppress unnecessary circulation of a coolant to suppress power consumption.

In the laser oscillator 10, the control unit 51 inhibits laser oscillation when the first temperature is higher than a second temperature (the allowable upper limit) or lower than a third. temperature (the allowable lower limit). In this manner, by setting the allowable upper limit and the allowable lower limit of the coolant temperature, it is possible to operate the laser oscillator 10 by taking the life span of the laser beam generating unit 12 into consideration.

2. Second Embodiment

In the laser oscillator 10 according to the first embodiment, the coolant circulating unit 20 is provided outside the housing 11. However, in a laser oscillator 10A according to the second embodiment, the coolant circulating unit 20 is provided inside the housing 11. Hereinafter, the second embodiment of the present invention will be described with reference to FIGS. 6 to 7. In the following description, the same components as the components of the laser oscillator 10 according to the first embodiment among the components of the laser oscillator 10A according to the second embodiment will be denoted by the same reference numerals, and the description thereof will be omitted. In the following description, the difference between the laser oscillator 10A according to the second embodiment and the laser oscillator 10 according to the first embodiment will be mainly described.

2.1 Configuration of Invention

Figure 6:
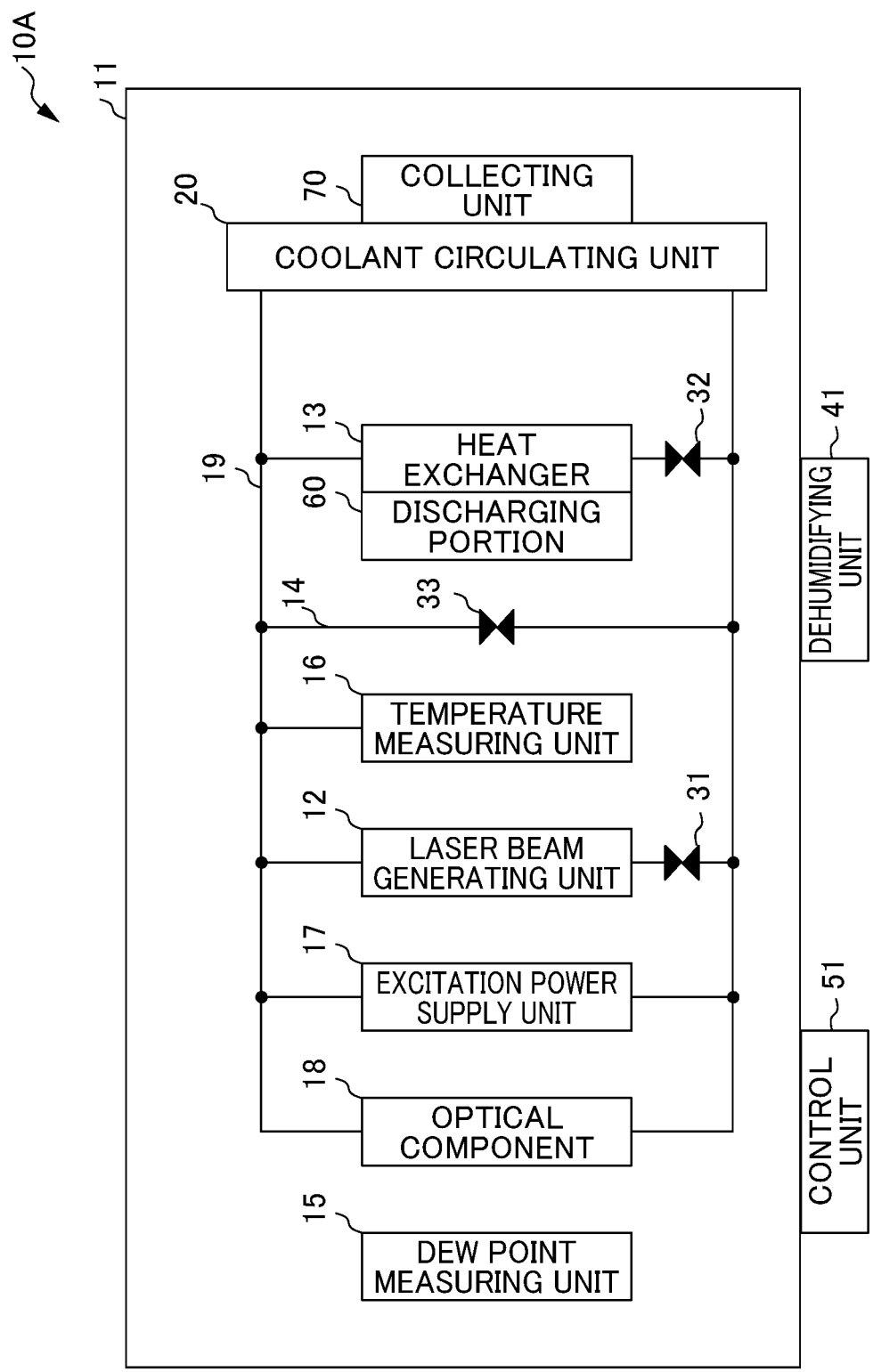
FIG. 6 is a diagram illustrating an overall configuration according to a second embodiment of the present invention.

FIG. 6 illustrates a schematic diagram of the laser oscillator 10A according to the second embodiment. As illustrated in FIG. 6, the laser oscillator 10A includes a housing 11 and a control unit 51. Inside the housing 11, a laser beam generating unit 12, a heat exchanger 13, a coolant bypass circuit 14, a dew point measuring unit 15, a temperature measuring unit 16, an excitation power supply unit 17, an optical part 18, a coolant circuit 19, a coolant circulating unit 20, a first valve 31, a second valve 32, a third valve 33, a dehumidifying unit 41, and a discharging portion 60 are stored.

The laser oscillator 10A further includes a collecting unit 70 that returns moisture condensed to the heat exchanger 13 and the coolant circuit 19 and water generated by the dehumidifying unit 41 dehumidifying the inside of the housing 11 to the coolant circulating unit 20.

Figure 7A:
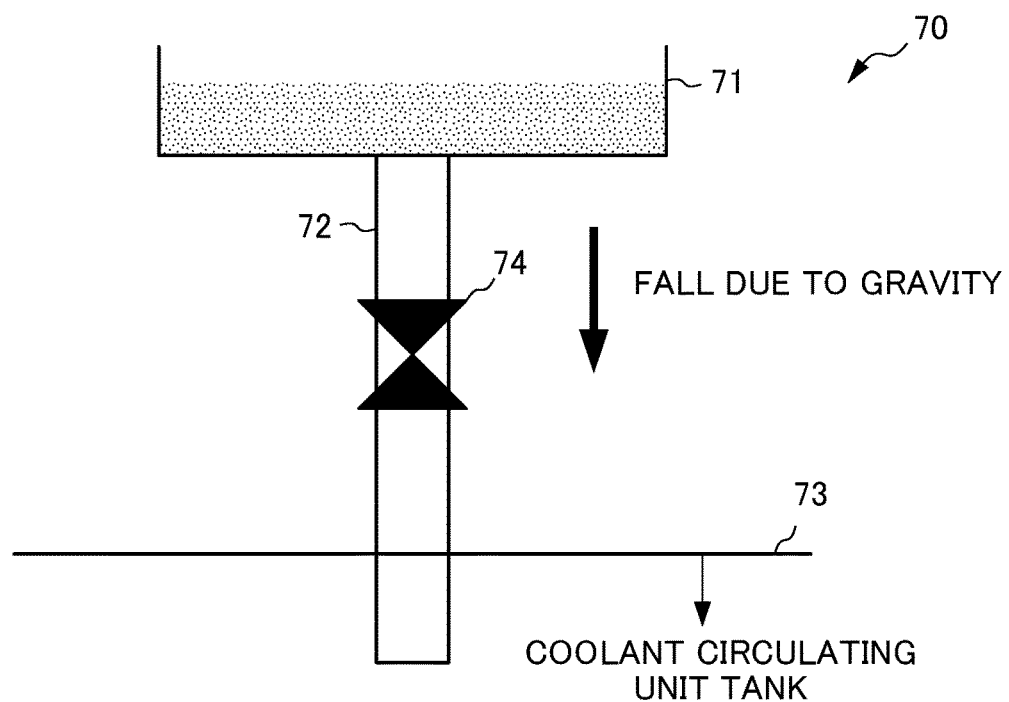
FIG. 7A is a diagram illustrating a configuration of a collecting unit according to the first embodiment of the present invention.

FIG. 7A illustrates an example of the collecting unit 70. The collecting unit 70 includes a saucer 71 that receives water generated as the result of dehumidification and a pipe 72 that collects the water collected in the saucer 71 to a coolant circulating unit tank 73. A check valve 74 is provided in the pipe 72. In this way, the water collected in the saucer 71 is collected in the coolant circulating unit tank 73 by the gravity. Furthermore, since the coolant circulating unit tank 73 is sealed and the pipe 72 is closed by the check valve, water does not leak outside the coolant circulating unit tank 3.

Figure 7B:
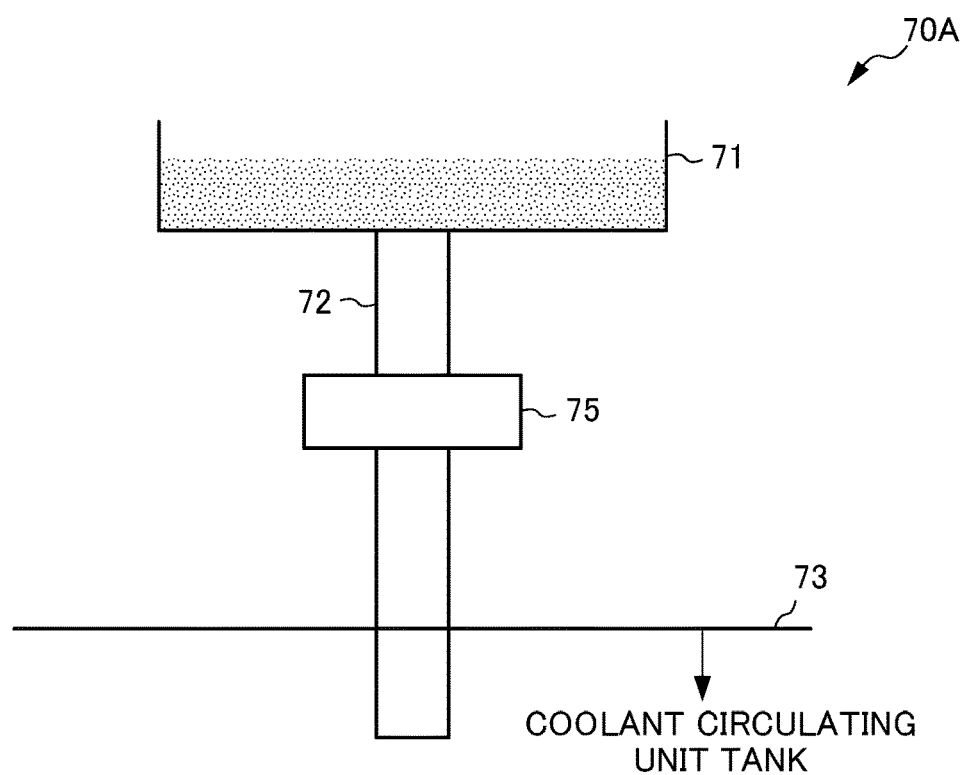
FIG. 7B is a diagram illustrating a configuration of the collecting unit according to the first embodiment of the present invention.

FIG. 7B illustrates another example of the collecting unit 70. A pressure pump 75 is provided in the pipe 72 of a collecting unit 70A instead of the check valve 74 or in addition to the check valve 74. The water collected in the saucer 71 is collected in the coolant circulating unit tank 73 by the pressure pump 75.

2.2 Advantage of Second Embodiment

In the laser oscillator 10A according to the second embodiment, the coolant circulating unit 20 is provided inside the housing 11. The laser oscillator 10 has means for collecting the moisture condensed to the heat exchanger 13 and the coolant circuit 19 in the coolant circulating unit 20. The laser oscillator 10A further includes the collecting unit 70 that returns the water generated by the dehumidifying unit 41 dehumidifying the inside of the housing 11 to the coolant circulating unit 20. Due to this, it is not necessary to discharge the moisture generated as the result of dehumidifying the inside of a warehouse to the outside and to provide a pipe in the outside. Therefore, it is possible to reduce the installation area of the laser oscillator 10A as a laser machining device.

The laser oscillator 10 includes means for collecting the moisture condensed to the heat exchanger 13 and the coolant circuit 19 in the coolant circulating unit 20. Since the laser oscillator 10A includes the collecting unit 70 that returns the water generated by the dehumidifying unit 41 dehumidifying the inside of the housing 11 to the coolant circulating unit 20, it is not necessary to discharge the moisture generated as the result of dehumidifying the inside of a warehouse to the outside. Therefore, it is possible to reduce the installation area of the laser oscillator 10A. In recent years, with an increase in the efficiency of a solid-state laser oscillator, the cooling capacity of a coolant circulation device decreases, and there is a demand for reducing the size of a laser machining device and saving the space. The laser oscillator 10A can cope with such a demand.

3. Third Embodiment

In the laser oscillator 10 according to the second embodiment, the coolant circulating unit 20 is provided outside the housing 11 and a coolant is circulated to the heat exchanger 13. In the laser oscillator 10B according to the third embodiment, the refrigerant used in the coolant circulating unit 20 is circulated to the heat exchanger 13, which is different from the second embodiment. Hereinafter, the third embodiment of the present invention will be described. In the following description, the same components as the components of the laser oscillator 10A according to the second embodiment among the components of the laser oscillator 10B according to the third embodiment will be denoted by the same reference numerals, and the description thereof will be omitted. In the following description, the difference between the laser oscillator 10B according to the third embodiment and the laser oscillator 10A according to the second embodiment will be mainly described.

3.1 Configuration of Invention

Figure 8:
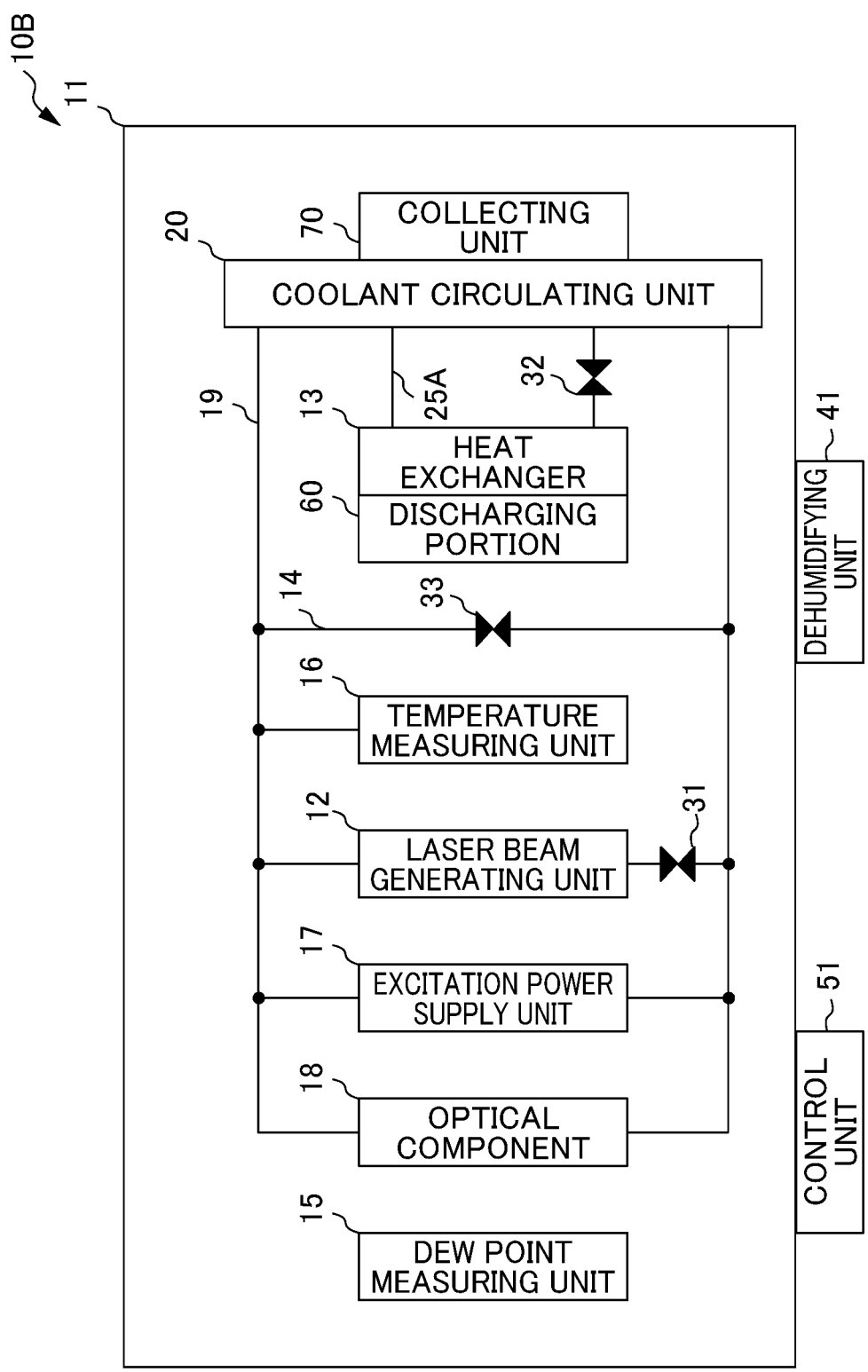
FIG. 8 is a diagram illustrating an overall configuration of a third embodiment of the present invention.
Figure 9:
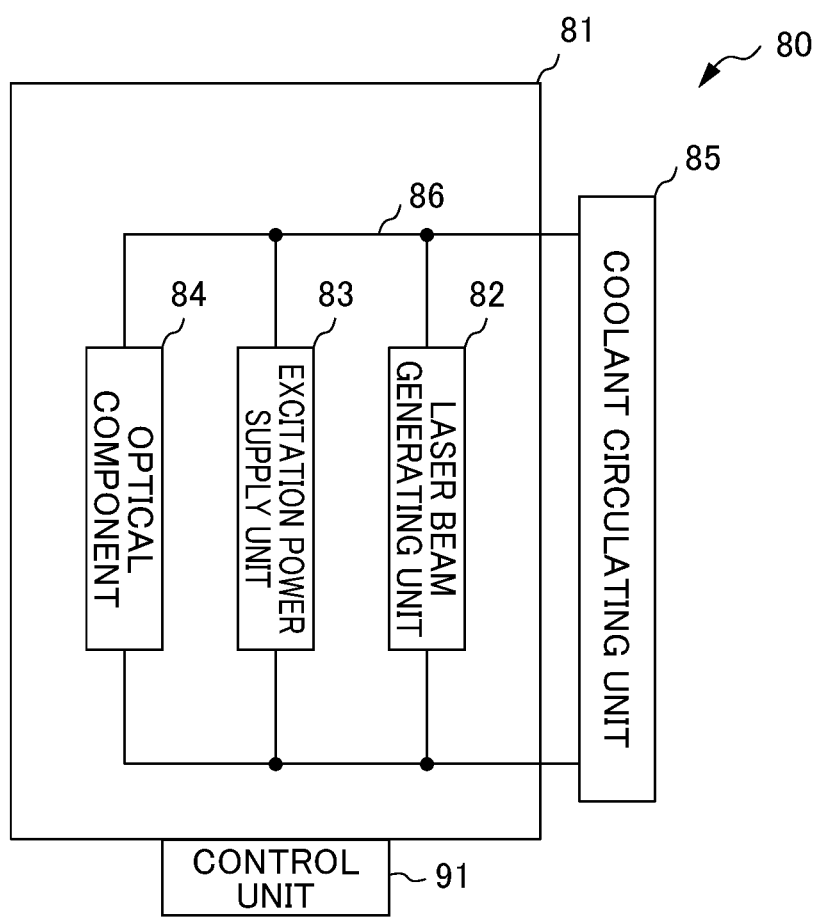
FIG. 9 is a diagram illustrating an overall configuration of a laser oscillator according to a conventional technique.
Figure 10:
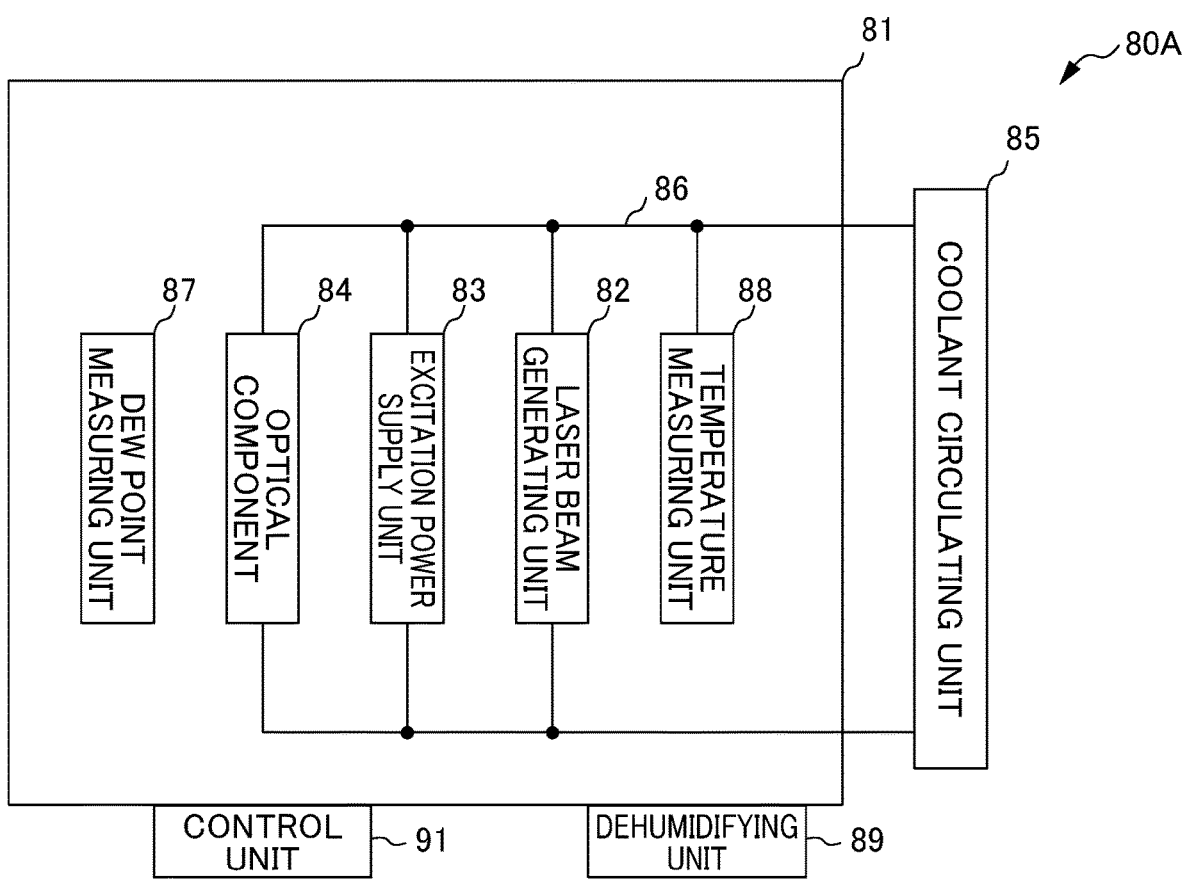
FIG. 10 is a diagram illustrating an overall configuration of a laser oscillator according to a conventional technique.
Figure 11:
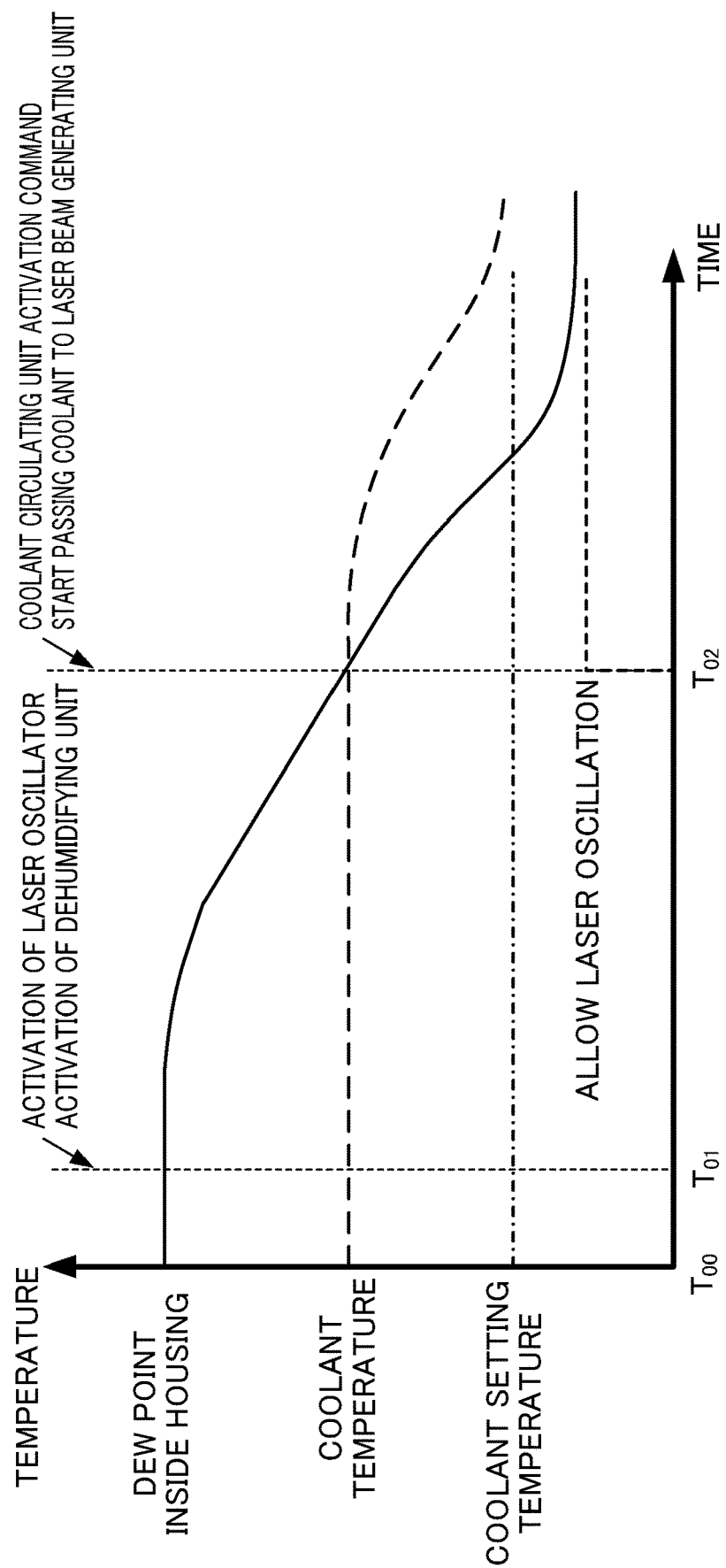
FIG. 11 is a diagram illustrating respective control timings according to the conventional technique.

FIG. 8 illustrates a schematic diagram of the laser oscillator 10B according to the third embodiment. As illustrated in FIG. 8, the laser oscillator 10B includes a housing 11 and a control unit 51. Inside the housing 11, a laser beam generating unit 12, a heat exchanger 13, a coolant bypass circuit 14, a dew point measuring unit 15, a temperature measuring unit 16, an excitation power supply unit 17, an optical part 18, a coolant circuit 19, a coolant circulating unit 20, a refrigerant circuit 25A, a first valve 31, a second valve 32, a third valve 33, and a dehumidifying unit 41 are stored. As illustrated in FIG. 8, a refrigerant used in the coolant circulating unit 20 is circulated directly to the heat exchanger 13 through the refrigerant circuit 25A, and the second valve 32 is provided in the refrigerant circuit 25A.

In this manner, in the laser oscillator 10B, since the coolant circulating unit 20 is accommodated in the housing 11, the heat in the heat exchanger 13 is exchanged by the refrigerant used in the coolant circulating unit 20.

3.2 Advantage of Third Embodiment

In the third embodiment, the heat exchanger 13 is connected to the refrigerant circuit 25A of the coolant circulating unit 20, and the amount of refrigerant cooling the heat exchanger 13 is adjusted by the second valve 32 provided in the refrigerant circuit 25A. In this way, it is possible to perform. heat exchange in the heat exchanger 13 more efficiently than when a coolant is used. As a result, the cooling performance and the dehumidifying performance of the heat exchanger 13 is improved, and the time taken until laser oscillation starts after activation of the laser oscillator 10B can be shortened further.

While the embodiments of the present invention have been described, the present invention is not limited to the above-described embodiments and modifications can be suitably made. The effects described in the present embodiment are only examples of most preferable effects produced by the present invention, and the effects of the present invention are not limited to those described in the present embodiment.

Modifcation 1

In the embodiments of the present invention, in order to increase the temperature of a coolant during activation of the laser oscillator 10, the first valve 31 is closed so that the coolant does not circulate through the laser beam generating unit 12, and the third valve 33 is open to drive the coolant feed pump of the coolant circulating unit 20 while turning off the coolant temperature control of the coolant circulating unit 20 so that the coolant temperature increases with the heat generated by the coolant feed pump. However, the present invention is not limited thereto. In order to increase the temperature of the coolant during activation of the laser oscillator 10, the first valve 31 may be closed so that the coolant does not circulate through the laser beam generating unit 12, the coolant temperature may be set to a predetermined temperature to pass the coolant to the laser beam generating unit 12 and to operate the heat exchanger 13. By doing so, the dew point inside the housing 11 decreases. Upon detecting that the coolant temperature measured by the temperature measuring unit 16 exceeds the dew point inside the housing 11 measured by the dew point measuring unit 15, the control unit 51 may open the first valve 31 to start passing the coolant to the laser beam generating unit 12 and allow laser oscillation.

Modification 2

In the embodiments of the present invention, during activation of the laser oscillator 10, when the dew point inside the housing 11 exceeds the coolant temperature, the first, second, and third valves are controlled on the basis of the dew point and the coolant temperature. However, the present invention is not limited thereto. For example, in a situation in which since the dew point inside the housing 11 exceeds the coolant temperature during a normal operation, the control unit 51 inhibits the laser oscillation, similar control may be executed when it is necessary to perform laser oscillation again.

EXPLANATION OF REFERENCE NUMERALS 10, 10A, 10B: Laser oscillator
11: Housing
12: Laser beam generating uni
13: Heat exchanger
14: Coolant bypass circuit
15: Dew point measuring unit
16: Temperature measuring unit
17: Excitation power supply unit
18: Optical part
19: Coolant circuit
20: Coolant circulating unit
31, 32, 33: Valve
51: Dehumidifying unit
51: Control unit
60, 60A: Discharging portion
70, 70A: Collecting unit

What is claimed is:
1. A laser oscillator comprising:
a laser beam generating unit;
a heat exchanger that cools a surrounding with a coolant;
a coolant bypass circuit;
a coolant, circuit connected to the laser beam generating unit, the heat exchanger, and the coolant bypass circuit;
a housing that stores the laser beam generating unit, the heat exchanger, the coolant bypass circuit, and the coolant circuit;
a coolant circulating unit that circulates the coolant to the laser beam generating unit, the heat exchanger, and the coolant bypass circuit with the aid of the coolant circuit;
a first valve that adjusts a flow rate of the coolant supplied to the laser beam generating unit;
a second valve that adjusts a flow rate of the coolant supplied to the heat exchanger;
a third valve that adjusts a flow rate of the coolant supplied to the coolant bypass circuit;
a dew point measuring unit that measures a dew point inside the housing;
a temperature measuring unit that measures a temperature of the coolant; and
a control unit that controls the first, second, and third valves on the basis of the dew point and the coolant temperature.

2. The laser oscillator according to claim 1, wherein the coolant circulating unit is provided outside the housing.

3. The laser oscillator according to claim 1, wherein the coolant circulating unit is provided inside the housing.

4. The laser oscillator according to claim 1, further comprising:
a discharging portion that discharges moisture condensed to the heat exchanger and the coolant circuit to the outside of the housing.

5. The laser oscillator according to claim 1, further comprising:
a collecting unit that collects moisture condensed to the heat exchanger and the coolant circuit to the coolant circulating unit.

6. The laser oscillator according to claim 1, further comprising:
a dehumidifying unit provided inside the housing; and a collecting unit that collects moisture generated from the dehumidifying unit to the coolant circulating unit.

7. The laser oscillator according to claim 1, wherein when the dew point measured by the dew point measuring unit is higher than the coolant temperature measured by the temperature measuring unit, the control unit closes the first valve and opens the second and third valves to inhibit laser oscillation.

8. The laser oscillator according to claim 1, wherein when the dew point measured by the dew point measuring unit is lower than the coolant temperature measured by the temperature measuring unit, the control unit opens the first valve and closes the third valve to allow laser oscillation.

9. The laser oscillator according to claim 1, wherein the control unit calculates a first temperature obtained by adding a predetermined temperature to the dew point measured by the dew point measuring unit and sends the first temperature to the coolant circulating unit as a setting temperature.

10. The laser oscillator according to claim 9, wherein the control unit inhibits laser oscillation when the first temperature is higher than a second predetermined temperature or lower than a third predetermined temperature.

11. The laser oscillator according to claim 1, wherein the control unit sends a flow rate of the coolant to at least one of the first, second, and third valves on the basis of the dew point measured by the dew point measuring unit and the coolant temperature measured by the temperature measuring unit.

12. A laser oscillator comprising:
a laser beam generating unit;
a heat exchanger that cools a surrounding with a refrigerant;
a coolant bypass circuit;
a coolant circuit connected to the laser beam generating unit and the coolant bypass circuit;

a refrigerant circuit connected to the heat exchanger;

a coolant circulating unit that circulates a coolant to the laser beam generating unit and the coolant bypass circuit with the aid of the coolant circuit and circulates the refrigerant to the heat exchanger with the aid of the refrigerant circuit;

a housing that stores the laser beam generating unit, the heat exchanger, the coolant bypass circuit, the coolant circuit, and the coolant circulating unit;

a first valve that adjusts a flow rate of the coolant supplied to the laser beam generating unit;

a second valve that adjusts a flow rate of the refrigerant supplied to the heat exchanger;

a third valve that adjusts a flow rate of the coolant supplied to the coolant bypass circuit;

a dew point measuring unit that measures a dewy point inside the housing;

a temperature measuring unit that measures a temperature of the coolant; and a control unit that controls the first, second, and third valves on the basis of the dew point and the coolant temperature.

\* \* \* \* \*